US008179160B1

(12) United States Patent
Chauhan et al.

(10) Patent No.: US 8,179,160 B1
(45) Date of Patent: May 15, 2012

(54) INPUT-OUTPUT (I/O) CIRCUIT SUPPORTING MULTIPLE I/O LOGIC-LEVEL SWINGS

(75) Inventors: Rajat Chauhan, Dehradun (IN); Ankur Gupta, Bangalore (IN); Vikas Narang, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/970,944

(22) Filed: Dec. 17, 2010

(51) Int. Cl.
*H03K 19/0175* (2006.01)
*H03K 19/094* (2006.01)

(52) U.S. Cl. ............... 326/83; 326/26; 326/58; 326/68; 326/81; 326/87

(58) Field of Classification Search ............ 326/56–58, 326/62–53, 68, 80–83, 86–87
See application file for complete search history.

(56) References Cited

U.S. PATENT DOCUMENTS

| | | | |
|---|---|---|---|
| 4,704,547 A | 11/1987 | Kirsch | |
| 5,684,415 A | 11/1997 | McManus | |
| 5,808,480 A | 9/1998 | Morris | |
| 6,208,167 B1 * | 3/2001 | Ranjan et al. | 326/81 |
| 7,091,755 B1 * | 8/2006 | Zhou et al. | 327/108 |
| 7,199,613 B2 | 4/2007 | Chauhan et al. | |
| 7,496,154 B2 | 2/2009 | Chintamani | |
| 7,515,392 B2 | 4/2009 | Jacob | |
| 2007/0046338 A1 * | 3/2007 | Bhattacharya et al. | 327/112 |

OTHER PUBLICATIONS

Hector Sanchez, Joshua Siegel, Carmine Nicoletta, James P. Nissen and Jose Alvarez, "A Versatile 3.3/2.5/1.8-V CMOS I/O Driver Built in a 0.2-μm, 3.5-nm Tox, 1.8-V CMOS Technology", IEEE Journal of Solid-State Circuits, vol. 34, No. 11, Nov. 1999, pp. 1501-511.
Rajat Chauhan, Karthik Rajagopal, Vinod Menezes, Roopashree H. M. and Sanish Koshy Jacob, "A High Performance, High Voltage Output Buffer in a Low Voltage CMOS process", IEEE 2005 Custom Integrated Circuits Conference, pp. 227-230.
Anne-Johan Annema, Govert Geelen and Peter De Jong, "5.5V Tolerant I/O in a 2.5V 0.25μm CMOS Technology", IEEE 2000 Custom Integrated Circuits Conference, pp. 417-420.
Yusuf Leblebici, "Design Considerations for CMOS Digital Circuits with Improved Hot-Carrier Reliability", IEEE Journal of Solid-State Circuits, vol. 31, No. 7 , Jul. 1996, pp. 1014-1024.
G. Chen, M. F. Li, C. H. Ang, J. Z. Zheng, and D. L. Kwong, "Dynamic NBTI of p-MOS Transistors and Its Impact on MOSFET Scaling", IEEE Electron Device Letters, vol. 23, No. 12, Dec. 2002, pp. 734-736.

* cited by examiner

*Primary Examiner* — Shawki S Ismail
*Assistant Examiner* — Jany Tran
(74) *Attorney, Agent, or Firm* — John R. Pressetto; W. James Brady; Frederick J. Telecky, Jr.

(57) ABSTRACT

An integrated circuit (IC) includes an input/output (I/O) circuit supporting high-speed operation and multiple I/O logic-level swings. The I/O circuit includes a first output signal chain to generate outputs with a first logic level swing, and a second output signal chain to generate outputs with a second logic level swing. The outputs of the first output signal chain and the second output signal chain are connected to a same output pad of the IC. Transistors in the first output signal chain and the second output signal chain are fabricated using corresponding gate oxide characteristics. The second output signal chain includes protection circuitry to prevent transistors in the second output signal chain from being subjected to voltage stresses beyond a safe limit. An input circuit in the I/O circuit similarly includes multiple input signal chains to enable reception of input signals of different logic-level swings from a same input pad.

10 Claims, 4 Drawing Sheets

INPUT-OUTPUT (I/O) CIRCUIT SUPPORTING MULTIPLE I/O LOGIC-LEVEL SWINGS

BACKGROUND

1. Technical Field

Embodiments of the present disclosure relate generally to integrated circuits (IC), and more specifically to an input-output (I/O) circuit supporting multiple I/O logic-level swings.

2. Related Art

Input-output (I/O) circuits are generally employed in integrated circuits (IC) to transmit signals via pins of an IC to components external to the IC, and to receive signals via pins of the IC from components external to the IC.

With respect to digital signals, I/O logic-level swing refers to the voltage difference between logic high and logic low levels of outputs of (and inputs to) the I/O circuit. For example, if an output signal of an I/O circuit has a logic high voltage of five volts (5V) and a logic low voltage of 0V, the logic-level swing of the output signal is 0V to 5V. Similarly, if an input signal to the I/O circuit has a logic high voltage of 5V and a logic low voltage of 0V, the logic-level swing of the input signal is 0V to 5V. In general, the I/O logic-level swing supported by the I/O circuit is 0V-5V.

An I/O circuit may need to support multiple I/O logic-level swings. Thus, the I/O circuit may need to be programmable to generate an output signal with one of multiple logic-level swings, such as, for example, 0V-5V and 0V-3.3V. Similarly, the I/O circuit may need to support reception of an input signal with one of multiple logic-level swings.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An output circuit in an integrated circuit (IC) includes a first output signal chain, a second output signal chain, and a logic block. The logic block is coupled to receive a binary data and a mode signal. The mode signal specifies whether an output signal representing the binary data is to be generated with a first logic-level swing or a second logic-level swing. If the mode signal specifies that the output signal is to be generated with the first logic-level swing, the logic block disables the second output signal chain and forwards the binary data to the first output signal chain. In response, the first output signal chain generates, on an output terminal of the IC, a first output signal representing the binary data with the first logic-level swing. If the mode signal specifies that the output signal is to be generated with the second logic-level swing, the logic block disables the first output signal chain and forwards the binary data to the second output signal chain. In response, the second output signal chain generates, on the output terminal of the IC, a second output signal representing the binary data with the second logic-level swing. The second logic-level swing is smaller than the first logic-level swing.

An input circuit in an integrated circuit (IC) includes a first input signal chain, a second input signal chain, a multiplexer and a logic block. The first input signal chain is coupled to receive an input signal on an input terminal of the IC and to generate a first signal representing the input signal. The second input signal chain is also coupled to receive the input signal on the input terminal of the IC and to generate a second signal representing the input signal. The multiplexer forwards one of the first signal and the second signal as a final output. If the input signal has a first logic-level swing, the logic block disables processing of the input signal in the second input signal chain. The first input signal chain generates the first signal, and the multiplexer forwards the first signal as the final output. If the input signal has a second logic-level swing, the logic block enables processing of the input signal in the second input signal chain. The second input signal chain generates the second signal, and the multiplexer forwards the second signal as the final output. The second logic-level swing is smaller than the first logic-level swing.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Device

Figure 1:
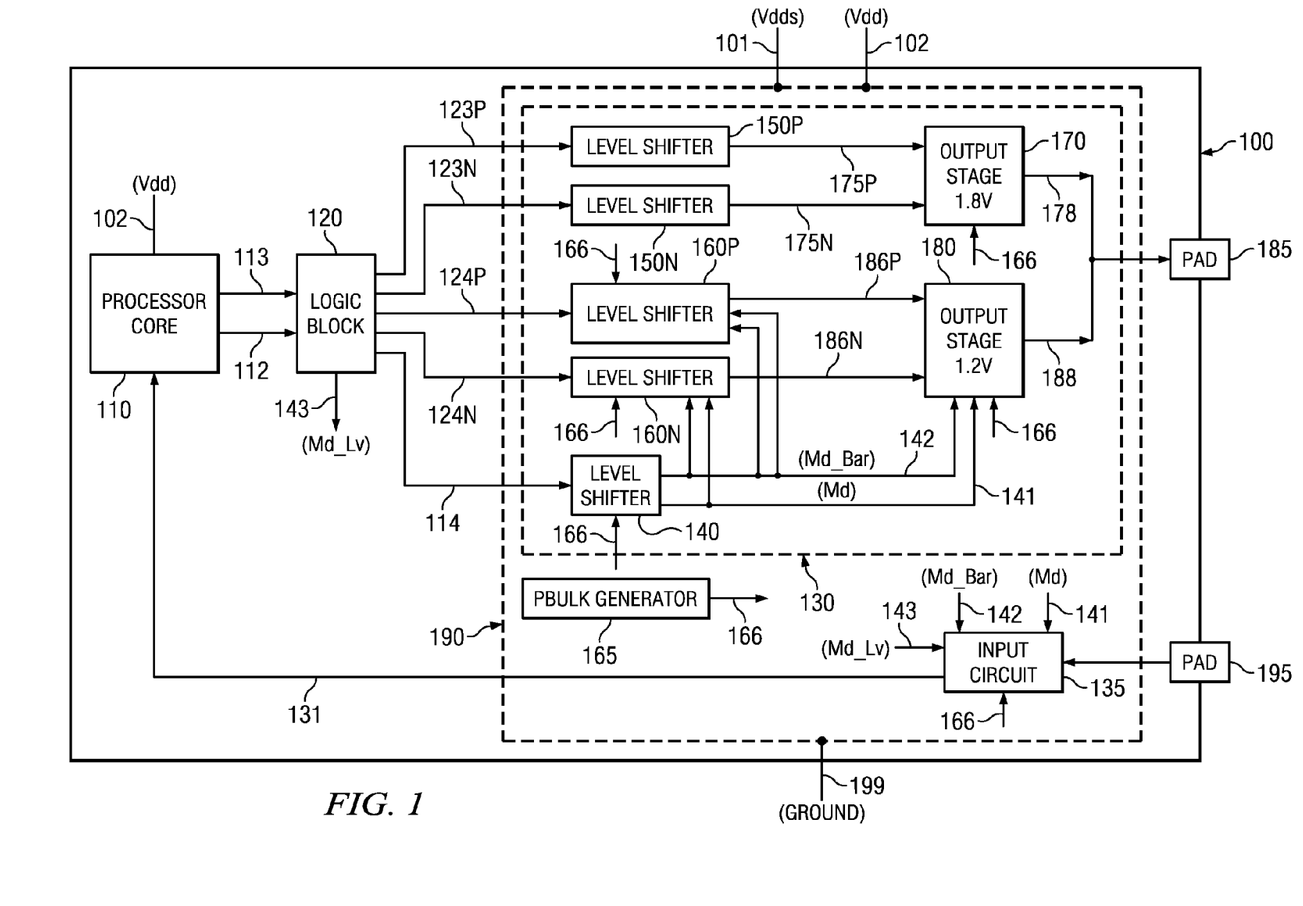
FIG. 1 is a block diagram illustrating the details of an example device in which several embodiments can be implemented.

FIG. 1 is a block diagram illustrating an example component in which several embodiments of the present disclosure can be implemented. The diagram shows integrated circuit (IC) 100 containing processor core 110, logic block 120, and input-output (I/O) circuit 190. I/O circuit 190 is shown containing output circuit 130, input circuit 135 and PBULK generator 165. Only the details of output circuit 130 are shown in FIG. 1. The details of input circuit 135 are described below with respect to FIG. 5. The details of FIG. 1 are meant to be merely illustrative, and real-world implementations may contain more blocks/components and/or different arrangement of the blocks/components.

Terminal 101 (Vdds) represents a power supply terminal, and is used to power components and blocks of I/O circuit 190. In the embodiment described below, power supply terminal 101 receives either a 1.8V supply or 1.2V supply, based on the requirement of voltage swings (i.e., voltage levels of logic zero and logic one) of input and output signals generated and received by I/O circuit 190. Terminal 102 (Vdd) represents another power supply terminal, and is used to power processor core 110. In addition, power supply 102 is also as a reference power supply terminal to maintain some circuit in I/O circuit 190 at a fixed (known) voltage level in some modes of operation, as described below with respect to FIG. 2, FIG. 3 and FIG. 6. In the embodiment described below terminal 102 receives a 1.0V supply. Ground terminal 199 is assumed to be connected to each of the blocks of I/O circuit 190.

I/O circuit 190 is referred to as operating in a 1.2V mode (second mode of operation) when output signals provided on pad 185 (output terminal/output pin/output pad) and input signals received on pad 195 (input terminal/input pin/input pad) have logic-level voltage swings of 0V to 1.2V (second logic-level swing). I/O circuit 190 is referred to as operating in a 1.8V mode (first mode of operation) when output signals provided on pad 185 and input signals received on pad 195 have logic-level voltage swings of 0V to 1.8V (first logic-level swing).

The signal chain (first output signal chain) containing level shifters 150P and 150N, and output stage 170 (referred to herein as the 1.8V-output signal chain or first output signal chain) is used when 1.8V-swing signals are to be provided as outputs on pad 185. The signal chain (second output signal chain) containing level shifters 160P and 160N, and output stage 180 (referred to herein as the 1.2V-output signal chain or second output signal chain) is used when 1.2V-swing signals are to be provided as outputs on pad 185. Transistors in level shifters 160P and 160N, and output stage 180 are fabricated using a 1.2V process (second process), and have gate oxide dimensions and other characteristics according to such 1.2V process. The 1.2V process may be viewed as being tailored for a 1.2V logic-level swing.

Transistors in level shifter 150P and 150N, and output stage 170 are fabricated using a 1.8V process (first process), and have gate oxide dimensions and other characteristics according to such 1.8V process. The 1.8V process may be viewed as being tailored for a 1.8V logic-level swing.

Figure 5:
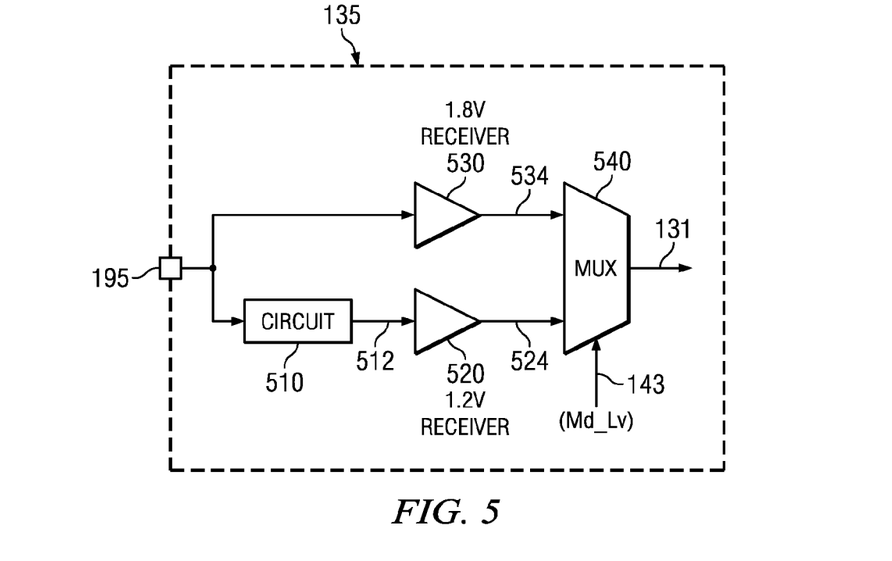
FIG. 5 is a diagram illustrating the block-level details of an input circuit of an I/O circuit, in an embodiment.

Input circuit 135 also contains corresponding 1.2V and 1.8V input signal chains, respectively fabricated using 1.2V and 1.8V processes respectively, and described in greater detail in FIG. 5. The specific voltages of 1.8V and 1.2V on power supply terminal 101 are meant to be merely illustrative. In other embodiments, other values of power supply voltages may instead be received on terminal 101. In such embodiments, gate oxide dimension of transistors in I/O circuit 190 may be correspondingly different.

Processor core 110 generates binary data in serial form (sequence of data values) on path 112, and a mode signal on path 113. The binary data on path 112 is generated with a voltage swing of 0V to 1.0V. The mode signal specifies whether output circuit 130 is to generate output signals with voltage swings of 0V-1.2V or 0V-1.8V, and also whether input circuit 135 is to receive and process input signals with voltage swings of 0V-1.2V or 0V-1.8V. Mode signal 113 may be provided to processor core 110 as an input via an input path (not shown), or specified by instructions of a user application executed by processor core 110. Processor 110 receives binary data from input circuit 135 on path 131.

Logic block 120 receives binary data 112 and mode signal 113. If mode signal 113 indicates that output circuit 130 is to operate in the 1.2V mode, logic block 120 forwards, on paths 124P and 124N, signals representing the data received on path 112. Logic block 120 generates control signals on paths 123P and 123N to tri-state (i.e., disable) the output of output stage 170. Although shown separately, logic block 120 may be viewed as being included in each of output circuit 130 and input circuit 135 as well.

If signal 113 indicates that output circuit 130 is to operate in the 1.8V mode, logic block 120 forwards, on paths 123P and 123N, signals representing the data received on path 112. Logic block 120 generates control signals on path 124P and 124N to tri-state (disable) the output of output stage 180. Logic block 120 forwards mode signal 113 as signal 114. Logic block 120 generates signals 143 (Md_Lv). In an embodiment, in response to receipt of a data value on path 112, logic block 120 generates control signals on paths 123P/123N or 124P/124N (depending on whether output stage 170 or output stage 180 is to generate the corresponding output on pad 185) such that a logical inverse of the data value received on path 112 is generated (by one the targeted one of output stage 170 or output stage 180) on pad 185.

PBULK generator 165 receives power supply voltages 102 (VDD) and 101 (VDDS), and provides on terminal 166 (PBULK) the higher of voltages 102 and 101 (VDDS). The provision of the voltage on terminal 166 is designed to present forward-bias bulk diode current from being generated during power-up and/or power down of IC 100. Voltage 166 is provided to each of level shifters 160P and 160N, output stage 170, output stage 180, level shifter 140 and input circuit 135.

Output circuit 130 is shown containing level shifters 150P and 150N (first pair of level shifters), level shifters 160P and 160N (second pair of level shifters), output stage 170 (first output stage) and output stage 180 (second output stage). In the 1.2V mode of operation, terminal 101 receives a 1.2V power supply, and each of level shifters 150P and 150N, level shifters 160P and 160N, output stage 170, output stage 180 and level shifter 140 is powered by the 1.2V power supply. In the 1.8V mode of operation, terminal 101 receives a 1.8V power supply, and each of level shifters 150P and 150N, level shifters 160P and 160N, output stage 170, output stage 180 and level shifter 140 is powered by the 1.2V power supply.

In the 1.2V mode, level shifters 160P and 160N receive signals representing a data value (as noted above) on paths 124P and 124N respectively. In response, level shifters 160P and 160N respectively generate control signals 186P and 186N with appropriate logic levels to cause output stage 180 to generate corresponding output signals representing the data value. Control signals 186P and 186N have a voltage swing of 0V to 1.2V. In the 1.8V mode of operation, level shifters 160P and 160N receive, on respective paths 124P and 124N, corresponding control signals specifying that the output of output stage 180 is to be tri-stated (disabled). In response, level shifters 160P and 160N generate respective control signals 186P and 186N, each with a value of 1.0V. The manner in which level shifter 160P operates is described in greater detail in sections below.

In the 1.8V mode of operation, level shifters 150P and 150N receive signals representing a data value on paths 123P and 123N respectively. In response, level shifters 150P and 150N respectively generate control signals 175P and 175N with appropriate logic levels to cause output stage 170 to generate corresponding output signals representing the data value. In the 1.2V mode of operation, level shifters 150P and 150N receive, on respective paths 123P and 123N, corresponding control signals specifying that the output of output stage 170 is to be tri-stated (disabled). In response, level shifter 150P generates control signal 175P with a value of 1.2V, and level shifter 150N generates control signal 175N with a value of 0V, to tri-state the output of output stage 170. Level shifters 150P and 150N may be implemented in a known way.

Output stage 180 receives control signals 186P and 186N. In the 1.2V mode, output stage 180 generates, on path 188 (second output signal), output signals (with a voltage swing of 0V to 1.2V) representing the data corresponding to control signals 186P and 186N. In the 1.8V mode, the output of output stage 180 is tri-stated by control signals 186P and 186N. In addition, corresponding protection circuitry contained within output stage 180 is operative to prevent transistors in output stage 180 from being subjected to voltage stresses beyond 1.2V (safe voltage). The output of output stage 180 is provided on pad 185 (output terminal).

Output stage 170 receives signals 175P and 176N. In the 1.8V mode, output stage 170 generates, on path 178 (first output signal), corresponding output signals (with a voltage swing of 0V to 1.8V) representing the data corresponding to control signals 175P and 175N. In the 1.2V mode, the output of output stage 170 is tri-stated by control signals 175P and 175N. In the 1.2V mode, transistors in output stage 170 are subjected only to voltage stresses of a maximum of 1.2V, and reliability issues are not of concern. The output of output stage 170 is provided on pad 185. Thus, the outputs of output stage 180 and 170 are connected to each other.

Level shifter 140 (fifth level shifter) receives signal 114, which specifies the mode of operation of output circuit 130. In response, level shifter 140 generates complementary mode signals 141(Md) and 142(Md_Bar) with appropriate logic levels. Mode signals 141 and 142 (which together form a pair of complementary mode signals) are used to enable (or disable) the operation of corresponding protection circuitry in output stage 180 and/or level shifters 160P and 160N. In the 1.2V mode of operation, mode signal 141(Md) equals 0V (representing logic low), and (complementary) mode signal 142 (Md_Bar) equals 1.2V (representing logic high). In the 1.8V mode, mode signal 141(Md) equals 1.8V (representing logic high), and (complementary) mode signal 142(Md_Bar) equals 0V (representing logic low). Transistors in level shifter 140 are fabricated using a 1.8V process.

Input circuit 135 receives an input signal at pad 195. The input signal may have a voltage swing of either 1.8V or 1.2V. Corresponding separate 'input signal chains' (to process either a 1.2V signal or a 1.8V signal) forward the input signal on path 131 with a 1.0V voltage swing. While input circuit 135 is shown as connected to a pad different from pad 185, in other embodiments, a same pad (e.g., 185) may be used both for generating outputs of I/O circuit 190 as well as for receiving inputs to I/O circuit 190. Input circuit 135 receives signals 141 (Md), 142 (Md_Bar), and 143 (Md_Lv). Input circuit 135 is described in greater detail below with respect to FIG. 5.

The use of separate signal chains enables output circuit 130 to cater to situations in which either a 1.2V-swing output or a 1.8V-swing output is to be provided, without compromising performance capabilities (for example, ability to support high bit-transfer rates) or incurring increased power consumption. Similar benefits may be obtained by the use of separate signal chains in input circuit 135 as well.

However, the connection of outputs of output stage 180 and output stage 170 on the same pad (185) may present reliability problems for output stage 180. When I/O circuit 190 operates in 1.8V mode, the 0V-1.8V swing outputs of output stage 170 may subject transistors in output stage 180 to inter-terminal (gate-source, gate-drain, drain-source, gate-bulk) voltages exceeding a safe limit of 1.2V. In an embodiment, output stage 180 is designed to include protection circuitry to prevent the transistors in output stage 180 from being subjected to voltage stresses greater than 1.2V in the 1.8V mode of operation. Transistors in output stage 170, being designed according to 1.8V processes, can withstand the output swing of 0V-1.2V of output stage 180 in the 1.2V mode, and hence do not present reliability problems.

2. Output Stage of 1.2V Signal Chain

Figure 2:
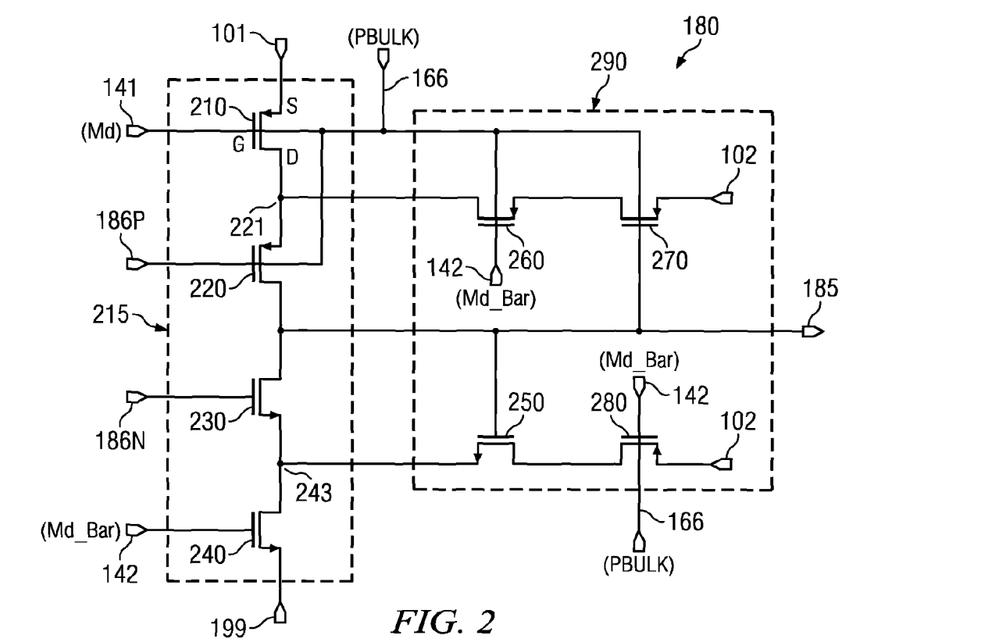
FIG. 2 is a circuit diagram illustrating the implementation details of an output stage of an I/O circuit, in an embodiment.

FIG. 2 is a circuit diagram illustrating the implementation details of output stage 180 in an embodiment. Output stage 180 is shown containing transistors 210, 220, 230, 240, 250, 260, 270 and 280. Transistors 210, 220, 260, 270 and 280 are P-type MOS (PMOS) transistors, while transistors 230, 240, and 250 are N-type MOS (NMOS) transistors. Gate, source and drain terminals of transistor 210 are respectively marked G, S and D. The terminals of other transistors are not marked in FIG. 2, but can be identified from the symbol/notation used. Circuit portion 290 represents a protection circuit (first protection circuit) used to prevent the transistors in output stage 180 from being subjected to voltage stresses greater than 1.2V, as described below. Circuit portion 290 is fabricated using 1.8V processes. However, circuit portion 290 does not affect the signal on pad 185, and therefore implementation of circuit portion 290 using 1.8V processes does not pose high-speed performance problems in output circuit 130.

The gate, source and drain terminals of transistor 210 are connected respectively to mode signal 141(Md), power supply 101(Vdds), and the source terminal of transistor 220. The gate and drain terminals of transistor 220 are connected respectively to control signal 186P and the drain terminal of transistor 230. The gate and source terminals of transistor 230 are connected respectively to control signal 186N and the drain terminal of transistor 240. The gate and source terminals of transistor 240 are connected respectively to complementary mode signal 142(Md_Bar) and ground terminal 199. The gate, drain and source terminals of transistor 250 are connected respectively to pad 185, drain terminal of transistor 280 and the drain terminal of transistor 240. The gate, drain and source terminals of transistor 260 are connected respectively to complementary mode signal 142 (Md_Bar), the source terminal of transistor 220 and the drain terminal of transistor 270. The gate and source terminals of transistor 270 are connected respectively to pad 185 and power supply 102 (Vdd). The gate and source terminals of transistor 280 are connected respectively to complementary (inverted) mode signal 142(Md_Bar) and to power supply 102(Vdd). The bulk terminals of transistors 210, 220, 260, 270 and 280 are connected to terminal 166 (PBULK). The voltage provided at terminal 166 (PBULK) is the higher of power supply voltage 102 (VDD) and 101 (VDDS), and is designed to present forward-bias bulk diode current from being generated during power-up and/or power down.

Operation in 1.2 V Mode

In the 1.2V mode, power supply 101(Vdds) equals 1.2V. Power supply 102 (Vdd) is 1.0V. Mode signal 141(Md) has a voltage level of (approximately) 0V, thereby causing transistor 210 to be ON. Inverted mode signal 142(Md_Bar) has a voltage level of (approximately) 1.2V, thereby causing transistor 240 to be ON.

When signal 124 is a logic low (corresponding to a logic low of data on path 112), each of control signals 186P and 186N has a voltage level of 0V (as generated by respective level shifters 160P and 160N). As a result, transistor 220 is ON and transistor 230 is OFF, and a logic high (with voltage level 1.2V) is generated on pad 185. When signal 124 is a logic high (corresponding to a logic high of data on path 112), each of control signals 186P and 186N has a voltage level of 1.2V. As a result, transistor 220 is OFF and transistor 230 is ON, and a logic low (with voltage level 0V) is generated on pad 185.

With respect to protection circuit 290, when output at pad 185 is at logic low, transistor 270 is ON since source terminal of transistor 270 is connected to power supply 102. However, transistor 260 is OFF due to signal 142 (Md_Bar) being 1.2V. Transistor 280 is OFF as gate terminal of transistor 280 is connected to mode signal 142(Md_Bar). As a result of each of transistor 260 and transistor 280 being OFF, protection circuit 190 is decoupled from the rest of the circuit of FIG. 2, and does not affect the operation of circuit portion 215 (buffer block). When the output at pad 185 is a logic high, transistor 270 is OFF since source terminal of transistor 270 is connected to power supply 102. Transistor 280 is OFF as gate terminal of transistor 280 is connected to signal 142(Md_Bar). As a result of both transistor 270 and transistor 280 being OFF, protection circuit 190 is decoupled from the rest of the circuit of FIG. 2, and does not affect the operation of circuit portion 215.

Operation in 1.8 V Mode

In the 1.8V mode, power supply 101(Vdds) equals 1.8V. Power supply 102 (Vdd) is 1.0V. Mode signal 141(Md) has a voltage level of 1.8V (representing a logic high), causing transistor 210 to be OFF. Inverted mode signal 142(Md_Bar) has a voltage level of 0V (representing a logic low), causing transistor 240 to be OFF. Output of output stage 180 is tri-stated (i.e., output stage 180 is decoupled from pad 185) due to transistors 210 and 240 being OFF. Level shifters 160P and 160N respectively generate control signals 186P and 186N with a voltage of 1.0V. In the 1.8V mode, the 1.8V signal chain (in particular output stage 170) generates 0V-1.8V swing output signals on pad 185.

When the voltage at pad 185 equals 1.8V, transistor 220 is ON due to a gate-drain voltage (−0.8V) exceeding the threshold voltage Vt of transistor 220. As a result, the 1.8V at pad 185 is forwarded on node 221. Hence, none of the inter-terminal voltages of transistor 220 exceeds 1.2V. However, transistor 230 is OFF, since gate-to-drain voltage of transistor 230 is negative. As a result, node 243 (which is connected to the source of transistor 230) is in a floating state, with the voltage at node 243 being indeterminate. Floating node 243 may develop a voltage (at least for short durations) that may result in at least some of the inter-terminal voltages of transistor 230 to exceed 1.2V, thereby potentially degrading the reliability of transistor 230. Protection circuit 290 prevents node 243 from floating. Specifically, transistor 280 is ON since inverted mode signal 142(Md_Bar) is 0V. Transistor 250 is also ON since the voltage at pad 185 is 1.8V. Since each of transistors 280 and 250 is ON, a voltage of 1.0V received from terminal 102(Vdd) is passed to node 243, thereby maintaining node 243 at 1.0V. With node 243 at 1.0V, none of the inter-terminal voltages of transistor 230 exceeds 1.2V, and reliability degradation of transistor is prevented.

When the voltage at pad 185 equals 0V, transistor 230 is ON due to a gate-drain voltage (1.0V) exceeding the threshold voltage Vt of transistor 230. As a result, the 0V at pad 185 is forwarded on node 243. Hence, none of the inter-terminal voltages of transistor 230 exceeds 1.2V. However, transistor 220 is OFF, since gate-to-drain voltage of transistor 220 is positive. As a result, node 221 (which is connected to the source of transistor 220) is in a floating state, with the voltage at node 221 being indeterminate. Floating node 221 may develop a voltage (at least for short durations) that may result in at least some of the inter-terminal voltages of transistor 220 to exceed 1.2V, thereby potentially degrading the reliability of transistor 220. Protection circuit 290 prevents node 221 from floating. Specifically, transistor 270 is ON since voltage at pad 185 is 0V. Transistor 260 is also ON since signal 142 (Md_Bar) is 0V. Since each of transistors 270 and 260 is ON, a voltage of 1.0V received from terminal 102(Vdd) is passed to node 221, thereby maintaining node 221 at 1.0V. With node 221 at 1.0V, none of the inter-terminal voltages of transistor 220 exceeds 1.2V, and reliability degradation of transistor is prevented.

3. Level Shifter of 1.2V Signal Chain

Figure 3:
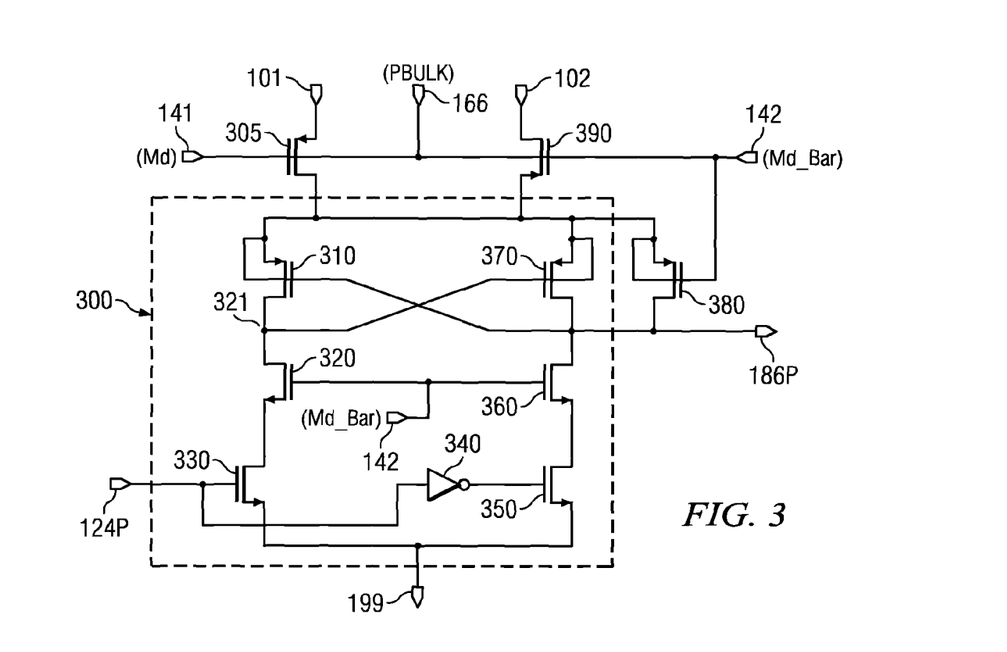
FIG. 3 is a circuit diagram illustrating the implementation details of a portion of a level shifter of an output stage of an I/O circuit, in an embodiment.

FIG. 3 is a circuit diagram illustrating the implementation details of level shifter 160P that drives transistor 220 of output stage 180 via path 186P, in an embodiment. Level shifter 160N that drives transistor 230 of output stage 180 via path 186N can be implemented in a manner similar to level shifter 160P shown in FIG. 3, and the details of level shifter 160N are not provided in the interest of conciseness. The circuit of FIG. 3 is shown containing transistors 305, 310, 320, 330, 350, 360, 370, 380 and 390, and inverter 340. Although a specific implementation of circuit portion 300 is shown in FIG. 3, in other embodiments, circuit portion 300 (which performs level shifting) can be implemented using other circuit topologies/connections or approaches as well.

The gate, source and drain terminals of transistor 305 are connected respectively to mode signal 141(Md), power supply 101(Vdds), and the source terminal of transistor 310. The gate and drain terminals of transistor 310 are connected respectively to output 186P and the drain terminal of transistor 320. The gate and source terminal of transistor 320 are connected respectively to complementary mode signal 142 (Md_Bar) and drain terminal of transistor 330. The gate and source terminals of transistor 330 are connected respectively to path 124 and ground terminal 199. The gate, source and drain terminals of transistor 350 are connected respectively to output of inverter 340, ground terminal 199 and source terminal of transistor 360. The gate and drain terminals of transistor 360 are connected respectively to complementary mode signal 142(Md_Bar) and drain terminal of transistor 370. The drain terminal of transistor is connected to output 186P. The gate and source terminals of transistor 370 are connected respectively to drain terminal of terminal 320 and the drain terminal of transistor 305. The gate, drain and source terminals of transistor 380 are connected respectively to complementary mode signal 142(Md_Bar), output 186P and source terminal of transistor 370. The gate, drain and source terminals of transistor 390 are connected respectively to complementary mode signal 142(Md_Bar), power supply 102(Vdd) and source terminals of transistor 370. The bulk terminals of transistors 305 and 390 are connected to terminal 295.

Operation in 1.2 V Mode

In 1.2V mode, power supply 101(Vdds) equals 1.2V. Power supply 102 (Vdd) is 1.0V. Mode signal 141(Md) has a voltage level of 0V, causing transistor 305 to be ON. As a result, the 1.2V of power supply 101 is passed to the source terminals of each of transistors 310, 370 and 380. Complementary mode signal 142 (Md_Bar) has a voltage level of 1.2V, causing transistor 390 to be OFF. Transistor 380 is OFF since the complementary mode signal 142 (Md_Bar) is at a voltage level of 1.2V, and the source of transistor 380 is at 1.2V.

When signal 124P is at voltage 1.2V (corresponding to a logic high data bit), transistor 330 is ON and transistor 350 is OFF. Transistor 320 is ON since complementary mode signal 142 (Md_Bar) equals 1.2V, and node 321 is pulled to ground (199). As a result, transistor 370 is ON, and the 1.2V at the source terminal of transistor 370 is passed to output 186P. Correspondingly, node 186N of the circuit of FIG. 2 would also be at 1.2V, and a logic low is provided on pad 185.

When signal 124P is at voltage 0V (corresponding to a logic zero data bit), transistor 330 is OFF and transistor 350 is ON. Transistor 360 is ON and node 186P is pulled to logic low (0V). Correspondingly, node 186N of the circuit of FIG. 2 would also be at 0V, and a logic high is provided on pad 185.

Operation in 1.8 V Mode

In the 1.8V mode, power supply 101(Vdds) equals 1.8V. Power supply 102 (Vdd) is 1.0V. Mode signal 141(Md) has a voltage level of 1.8V, causing transistor 305 to be OFF. Inverted mode signal 142(Md_Bar) has a voltage level of 0V, causing transistor 390 to be ON and transistors 320 and 360 to be OFF. Transistor 380 is ON since signal 142(Md_Bar) is at 0V. As a result 1.0V is generated at output 186P. Correspondingly, node 186N of the circuit of FIG. 2 would also be at 1.0V.

4. Output Stage of 1.8V Signal Chain

Figure 4:
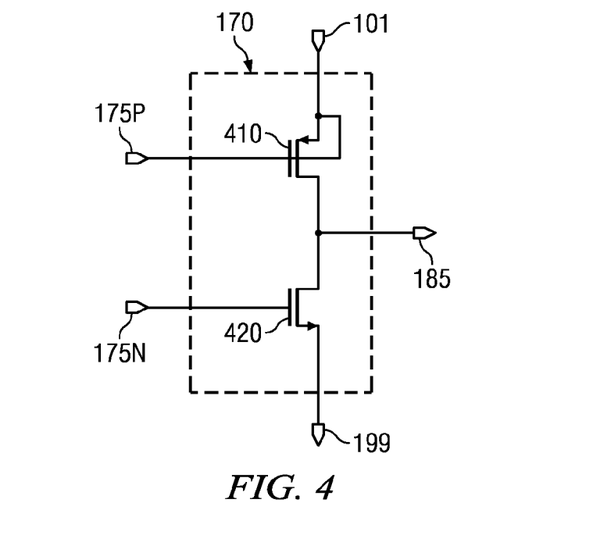
FIG. 4 is a circuit diagram illustrating the implementation details of another output stage of an I/O circuit, in an embodiment.

FIG. 4 is a circuit diagram illustrating the implementation details of output stage 170 in an embodiment. Output stage 170 is shown containing transistors 410 and 420. The gate, source and drain terminals of transistor 410 are connected respectively to control signal 175P, power supply 101(Vdds), and the drain terminal of transistor 420. The gate and source terminals of transistor 420 are connected respectively to output 175N and ground terminal 199.

In the 1.8V mode of operation, when data on 112 is a logic high (with signals 123P and 123N representing the logic high value of data 112), level shifters 150P and 150N generate each of respective signals 175P and 175N with a voltage of 1.8V. As a result, transistor 410 is OFF and transistor 420 is ON, and a logic low (0V) is generated on pad 185. When data 112 is a logic low, level shifters 150P and 150N generate each of respective signals 175P and 175N with a voltage of 0V. As a result, transistor 410 is ON and transistor 420 is OFF, and a logic high (1.8V) is generated on pad 185.

In the 1.2V mode of operation (and as also noted above), level shifter 150P generates control signal 175P with a value of 1.2V, and level shifter 150N generates control signal 175N with a value of 0V, to tri-state the output of output stage 170.

Control signals 175P and 175N are generated by level shifters 150P and 150N (of FIG. 1) respectively. Level shifters 150P and 150N may be implemented in a known way, such as, for example, in a manner similar to the implementation of level shifters 160P and 160N, except that transistors 305, 390 and 380 and the associated connections are not required.

5. Input Circuit

FIG. 5 is a diagram illustrating the block-level details of input circuit 135. Input circuit 135 receives input signals on pad 195 (e.g., from circuits external to IC 100). The input signals may have logic-level voltage swings of either 0V to 1.2V (1.2V mode of operation) or 0V to 1.8V (1.8V mode of operation). Input circuit 135 is shown containing 1.8V-receiver 530 (first input signal chain), 1.2V-receiver 520, circuit 510 and multiplexer (MUX) 540. The combination of 1.2V-receiver 520 and circuit 510 is referred to herein as a second input signal chain.

Transistors in 1.8V-receiver 530 are fabricated using a 1.8V process, while transistors in 1.2V-receiver 520 are fabricated using a 1.2V process. Each of receivers 530 and 520 can be implemented in a known way. MUX 540 forwards on path 131 (final output), one of output 524 (output of 1.2V-receiver 520) and output 534 (output of 1.8V-receiver 530) based on the value of select signal 143(Md_Lv).

Figure 6:
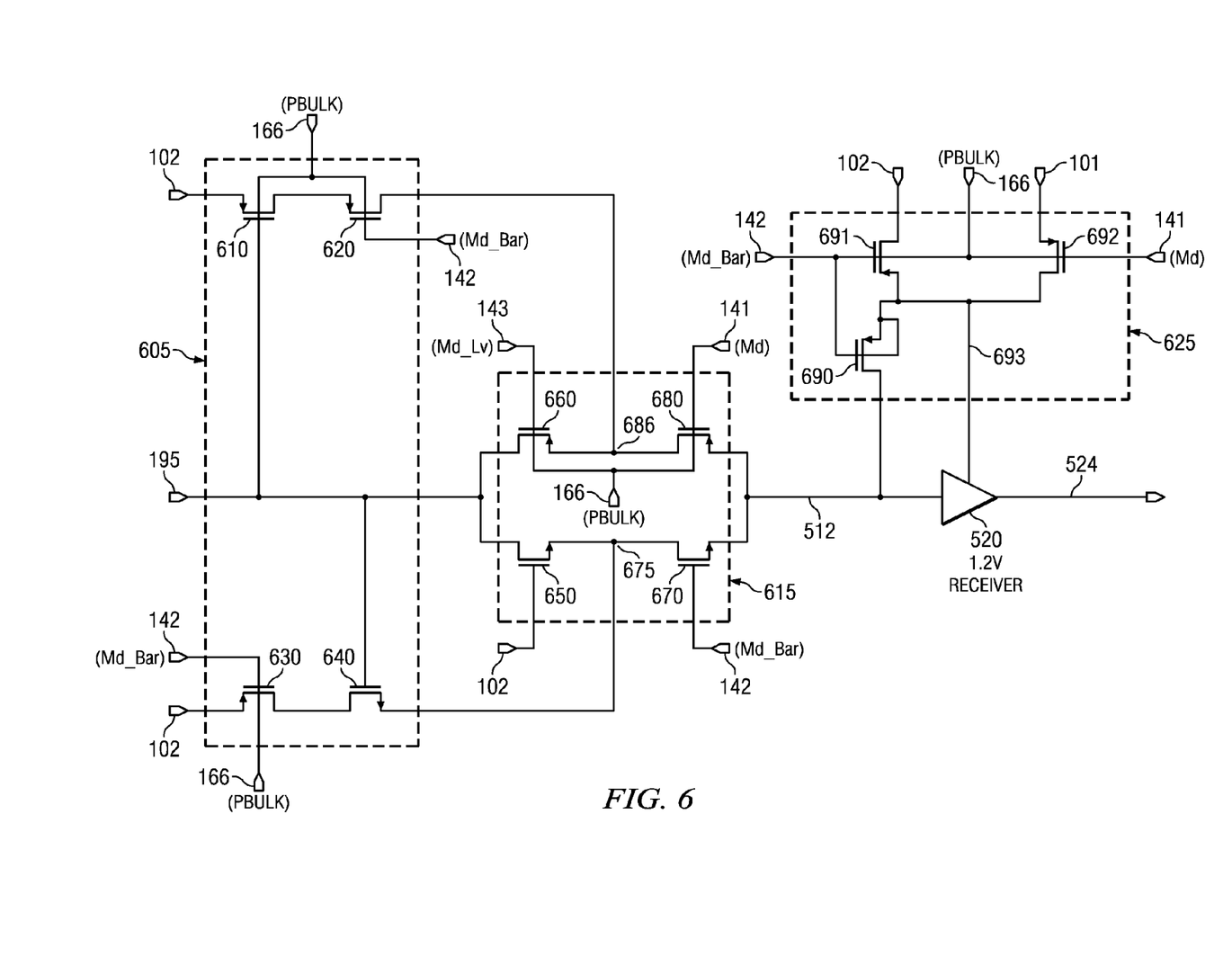
FIG. 6 is a diagram showing the implementation details of a portion of an input circuit, in an embodiment.

An embodiment of circuit 510 is shown in greater detail in FIG. 6. Blocks 605, 615 and 625 together represent circuit 510 of FIG. 5. 1.2V-receiver 520 is also shown in FIG. 6.

Switch block 615 is shown containing transistors 650, 660, 670 and 680, each fabricated in a 1.2V process. Protection circuit 605 (second protection circuit) is shown containing transistors 610, 620, 630 and 640, each fabricated in a 1.8V process. Protection circuit 625 (third protection circuit) is shown containing transistors 690, 691 and 692, each fabricated in a 1.2V process. Transistors 610, 620, 630, 660, 680, 690, 691 and 692 in the circuit of FIG. 6 are PMOS transistors, while transistors 640, 650 and 670 are NMOS transistors.

Switch block 615 decouples input signals received on pad 195 from input (512) of 1.2V-receiver 520 when input circuit 135 operates in the 1.8V mode. Protection circuit 605 prevents transistors in switch block 615 from being subjected to voltage stresses greater than 1.2V in the 1.8V mode. Protection circuit 625 prevents receiver 520 from being subjected to voltage stresses greater than 1.2V in the 1.8V mode.

Referring to switch block 615, the gate, source and drain terminals of transistor 660 are connected respectively to low-voltage mode signal 143 (Md_Lv), drain terminal of transistor 680 and drain terminal of transistor 650. The gate and source terminals of transistor 680 are connected respectively to mode signal 141(Md) and input 512 of receiver 520. The gate, drain and source terminals of transistor 670 are connected respectively to complementary mode signal 142(Md_Bar), source of transistor 650 and input 512. The gate and drain of transistor 650 are connected respectively to power supply 102(Vdd), and pad 195.

Referring to protection circuit 605, the gate, source and drain terminals of transistor 630 are connected respectively to signal 142(Md_Bar), power supply 102(Vdd) and drain of transistor 640. The gate and source terminals of transistor 640 are connected respectively to pad 195 and source terminal of transistor 650. The gate, source and drain terminals of transistor 620 are connected respectively to signal 142(Md_Bar), drain terminal of transistor 610 and source terminal of transistor 660. The gate and source terminals of transistor 610 are connected respectively to pad 195 and power supply 102 (Vdd).

Referring to protection circuit 625, the gate, source and drain terminals of transistor 690 are connected respectively to signal 142(Md_Bar), source terminal of transistor 691, and input 512. The gate and drain of transistor 691 are connected respectively to signal 142(Md_Bar) and power supply 102 (Vdd). The gate, source and drain terminals of transistor 692 are connected respectively to mode signal 141(Md), power supply 101(Vdds) and source terminal of transistor 691. Terminal 693 represents a power supply terminal of receiver 520, and is connected to the drain of transistor 692.

Operation in 1.2 V Mode

In the 1.2V mode, power supply 101(Vdds) equals 1.2V. Power supply 102 (Vdd) equals 1.0V. Mode signal 141(Md) has a voltage level of 0V. Complementary mode signal 142 (Md_Bar) has a voltage level of 1.2V. Signal 143(Md_Lv) has a voltage level of 0V, and MUX 540 forwards signals on path 524 on path 131. Transistor 692 of protection circuit 625 is ON in the 1.2V mode.

Referring to switch block 615, when pad 195 is at 1.2V (corresponding to a logic high input data bit), transistor 650 is OFF since the gate-drain voltage of transistor 650 is negative. Transistor 670 is also OFF. Transistor 660 is ON due to gate-drain voltage (−1.2V) exceeding the threshold voltage Vt of transistor 660. Transistor 680 is also ON. As a result, the 1.2V signal received on pad 195 is passed to input 512. In response 1.2V-receiver 520, generates a 1V signal on path 524, which is forwarded by MUX 540 on path 131.

When pad 195 is at 0V (corresponding to a logic low input data bit), transistor 650 is ON due to gate-drain voltage of transistor 650 being greater than the threshold voltage Vt of transistor 650. Transistor 670 is ON due to gate-drain voltage (1.2V) exceeding the threshold voltage Vt of transistor 670.

As a result, the 0V input on pad 195 is passed to input 512, and 1.2V-receiver 520 generates a 0V signal on path 524, which is forwarded by MUX 540 on path 131. Protection circuit 605 is decoupled from the rest of input circuit 510 in the 1.2V mode.

Operation in 1.8 V Mode

In the 1.8V mode, power supply 101(Vdds) equals 1.8V. Power supply 102 (Vdd) is 1.0V. Mode signal 141(Md) has a voltage level of 1.8V. Inverted mode signal 142(Md_Bar) has a voltage level of 0V. Signal 143(Md_Lv) has a voltage level of 1.0V, and MUX 540 forwards signals on path 534 on path 131.

When pad 195 is at 1.8V (corresponding to a logic high input data bit), transistor 660 is ON due to gate-drain voltage (−0.8V) exceeding the threshold voltage Vt of transistor 660. However, transistor 680 is OFF. Transistor 650 is OFF due to gate-drain voltage (−0.8V) being negative. Transistor 670 is also OFF. Hence, the signal at pad 195 is prevented from being passed to input 512. When pad 195 is at 0V (corresponding to a logic low input data bit), transistor 650 is ON. However transistor 670 is OFF. Transistors 660 and 680 are also OFF. Again, the signal at pad 195 is prevented from being passed to input 512.

With respect to switch block 615, when pad 195 is at 1.8V, transistors 650 and 670 are OFF. As a result, node 675 (which is connected to the source of transistor 650) is in a floating state. Floating node 675 may develop a voltage that may result in one or more of the inter-terminal voltages of transistor 650 to exceed 1.2V, thereby potentially degrading the reliability of transistor 650. Protection circuit 605 prevents node 675 from floating. Specifically, transistor 630 is ON since complementary mode signal 142(Md_Bar) is at 0V. Transistor 640 is also ON since the voltage at pad 185 is 1.8V. Since each of transistors 630 and 640 is ON, the 1.0V received from terminal 102(Vdd) is passed to node 675, thereby maintaining node 675 at 1.0V. With node 675 at 1.0V, none of the inter-terminal voltages of transistor 650 exceeds 1.2V.

When pad 195 is at 0V, transistors 660 and 680 are OFF. As a result, node 686 (which is connected to the source of transistor 660) is in a floating state. Floating node 686 may develop a voltage that may result in at least some of the inter-terminal voltages of transistor 660 to exceed 1.2V, thereby potentially degrading the reliability of transistor 660. Protection circuit 605 prevents node 686 from floating. Specifically, transistor 610 is ON since voltage at pad 185 is 0V. Transistor 620 is also ON since complementary mode signal 142(Md_Bar) is at 0V. Since each of transistors 610 and 620 is ON, a voltage of 1.0V received from terminal 102(Vdd) is passed to node 686, thereby maintaining node 686 at 1.0V. With node 686 at 1.0V, none of the inter-terminal voltages of transistor 660 exceeds 1.2V.

1.2V-receiver 520 is connected to power supply 101(Vdds). Hence, 1.2V-receiver 520 is subjected to a voltage of 1.8V when input circuit 135 operates in the 1.8V mode. Protection circuit 625 prevents receiver 520 from being subjected to voltage stresses above 1.2V. Specifically, in the 1.8V mode, transistor 692 is OFF since mode signal 141(Md) is at 1.8V. Transistor 691 is ON since complementary mode signal 142(Md_Bar) is at 0V. Transistor 690 is also ON. As a result, the 1.0V received from terminal 102(Vdd) is passed to power supply terminals 693 of receiver 520. Input 512 is also maintained at 1.0V.

I/O circuit 190 implemented as described above supports high-speed operation as well. It may be observed that 1.8V signal chains (in the input and output circuits in I/O circuit 190) are not used when 0V-1.2V logic-level swing input and output signals are to be supported and generated. It is noted that such operation is possible, as in some prior approaches, in which the 1.8V gate-oxide transistors of the corresponding 1.8V signal chains are under-driven to support 1.2V operation. Instead, in embodiments of the present disclosure, separate 1.2V signal chains (for transmit/output and receive/input operations) employing 1.2V gate-oxide transistors are used to support 1.2V operation, thereby not incurring any speed-penalty in the 1.2V mode. In the 1.8V mode, high-speed operation is supported by the respective 1.8V output and input signal chains.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, NMOS and PMOS transistors may be interchanged, while also interchanging the connections to power and ground terminals. Accordingly, in the instant application, the power and ground terminals are referred to as reference potentials, the source (emitter) and drain (collector) terminals of transistors (though which a current path is provided when turned on and an open path is provided when turned off) are termed as current terminals, and the gate (base) terminal is termed as a control terminal.

In the illustrations of FIGS. 1, 2, 3, 4, 5 and 6, although terminals/nodes are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An integrated circuit (IC) comprising:
    a first output signal chain;
    a second output signal chain; and
    a logic block;
    wherein the logic block is coupled to receive a binary data and a mode signal, wherein the mode signal specifies whether an output signal representing the binary data is to be generated with a first logic-level swing or a second logic-level swing;
    wherein, if the mode signal specifies that the output signal is to be generated with the first logic-level swing, the logic block disables the second output signal chain and forwards the binary data to the first output signal chain, the first output signal chain generating, on an output terminal of the IC, a first output signal representing the binary data with the first logic-level swing as the output signal, and
    wherein, if the mode signal specifies that the output signal is to be generated with the second logic-level swing, the logic block disables the first output signal chain and forwards the binary data to the second output signal chain, the second output signal chain generating, on the output terminal of the IC, a second output signal representing the binary data with the second logic-level swing as the output signal,
    wherein the second logic-level swing is smaller than the first logic-level swing;
    wherein the first output signal chain comprises components fabricated according to a first process tailored for the first logic-level swing, wherein the second output signal chain comprises components fabricated according to a second process tailored for the second logic-level swing, whereby at least some components in the second output signal chain have a smaller gate oxide thickness than components in the first output signal chain, wherein the at least some components include transistors;

wherein the second output signal chain comprises a first protection circuit to prevent components in the second output signal chain from being subjected to voltages exceeding a safe voltage determined by the second process;

further comprising a processor to generate the binary data with a logic-level swing smaller than the second logic-level swing;

wherein the first output signal chain comprises a first output stage and a first pair of level shifters comprising a first level shifter and a second level shifter, wherein the second output signal chain comprises a second output stage and a second pair of level shifters comprising a third level shifter and a fourth level shifter, wherein the second output stage includes the first protection circuit;

wherein each of the first pair of level shifters and the second pair of level shifters is coupled to the logic block, and wherein the first output stage and the second output stage are respectively coupled to the first pair of level shifters and the second pair of level shifters, wherein, if the output signal is to be generated with the first logic-level swing, the first pair of level shifters receives respective signals representing the binary data from the logic block, the first pair of level shifters forwarding control signals to the first output signal chain to cause generation of the first output signal, and wherein, if the output signal is to be generated with the second logic-level swing, the second pair of level shifters receives signals representing the binary data from the logic block, the second pair of level shifters forwarding control signals to the second output signal chain to cause generation of the second output signal;

further comprising a fifth level shifter coupled to the logic block, the fifth level shifter to receive the mode signal, and to generate a pair of complementary mode signals, the fifth level shifter providing the pair of complementary mode signals to the first protection circuit in the second output stage to enable the first protection circuit to prevent components in the second output stage from being subjected to voltages exceeding a safe voltage determined by the second process.

2. The IC of claim 1, further comprising:
a first input signal chain coupled to receive an input signal on an input terminal of the IC and to generate a first signal representing the input signal;
a second input signal chain also coupled to receive the input signal on the input terminal of the IC and to generate a second signal representing the input signal; and
a multiplexer to forward one of the first signal and the second signal as a final output, wherein, if the input signal has a first logic-level swing, the logic block disables processing of the input signal in the second input signal chain, the first input signal chain generating the first signal, and the multiplexer forwarding the first signal as the final output, wherein, if the input signal has a second logic-level swing, the logic block enables processing of the input signal in the second input signal chain, the second input signal chain generating the second signal, and the multiplexer forwarding the second signal as the final output.

3. The IC of claim 2, wherein the first input signal chain comprises components fabricated according to the first process, and wherein the second input signal chain comprises components fabricated according to the second process, whereby at least some components in the second input signal chain have a smaller gate oxide thickness than components in the first input signal chain, wherein the at least some components include transistors.

4. The IC of claim 3, wherein the second input signal chain comprises a second protection circuit to receive the complementary mode signals and operable to prevent components in the second input signal chain from being subjected to voltages exceeding a safe voltage determined by the second process when the input signal has the first logic-level swing.

5. An output stage of an output circuit of an integrated circuit (IC), the output stage comprising:
a buffer block coupled to receive a pair of control signals; and
a first protection circuit,
wherein, in a second mode of operation of the output circuit, the buffer block receives a power supply voltage of a first value, wherein the pair of control signals has values representing a binary data, the buffer block generating, on an output terminal of the IC, a first output signal representing the binary data with a second logic-level swing,
wherein, in a first mode of operation of the output circuit, the buffer block receives a power supply voltage of a second value, wherein another output stage of the output circuit generates, on the output terminal, a second output signal with a first logic-level swing, wherein the pair of control signals has values that tri-state the buffer block, and wherein the protection circuit generates voltages on nodes of the buffer block with values designed to prevent transistors in the buffer block from being subjected to voltages exceeding a safe voltage determined by a fabrication process according to which the transistors in the buffer block are fabricated;
wherein the second logic-level swing is smaller than the first logic-level swing, the first value being smaller than the second value;
wherein the buffer block comprises:
a first transistor, wherein a source terminal of the first transistor is coupled to a power supply terminal receiving the power supply voltage, and a gate terminal of the first transistor is coupled to a first enable signal;
a second transistor, wherein a source terminal of the second transistor is coupled to a drain terminal of the first transistor, and a gate terminal of the second transistor is coupled to a first one of the pair of control signals;
a third transistor, wherein a drain terminal of the third transistor is coupled to a drain terminal of the second transistor, and a gate terminal of the third transistor is coupled to a second one of the pair of control signals;
a fourth transistor, wherein a drain terminal of the third transistor is coupled to a source terminal of the third transistor, a gate terminal of the fourth transistor is coupled to a second enable signal that is the logic inverse of the first enable signal, and the source terminal of the fourth transistor is coupled to a constant reference potential,
wherein a junction of the drain terminal of the second transistor and the drain terminal of the third transistor is coupled to the output terminal, wherein the first enable signal and the second enable signal have values which, in the first mode of operation, switch OFF the first transistor and the fourth transistor, and wherein the first enable signal and the second enable signal have values which, in the second mode of operation, switch ON the first transistor and the fourth transistor.

6. The output stage of claim 5, wherein the first protection circuit comprises:

a fifth transistor, wherein a drain terminal of the fifth transistor is coupled to a first junction node formed by the drain terminal of the first transistor and the source terminal of the second transistor, wherein a gate terminal of the fifth transistor is coupled to receive a first one of a pair of mode signals, wherein the pair of mode signals specify whether the output circuit is to operate in the first mode or the second mode;

a sixth transistor, wherein a drain terminal of the sixth transistor is coupled to a source terminal of the fifth transistor, a gate terminal of the sixth transistor is coupled to the output terminal, and a source terminal of the sixth transistor is coupled to a second power supply voltage;

a seventh transistor, wherein a source terminal of the seventh transistor is coupled to a second junction node formed by the drain terminal of the fourth transistor and the source terminal of the third transistor, and wherein a gate terminal of the seventh transistor is coupled the output terminal; and an eighth transistor, wherein a drain terminal of the eighth transistor is coupled to a drain terminal of the seventh transistor, a gate terminal of the eighth transistor is coupled to receive a second one of the pair of mode signals, and a source terminal coupled to the second power supply voltage, whereby, in the first mode of operation of the output circuit, the transistors of the protection circuit are operable to maintain the first junction node and the second junction node at a voltage equal to the second power supply voltage, thereby preventing the second transistor and the third transistor from being subjected to inter-terminal voltages exceeding the safe voltage.

7. A signal chain in an input circuit of an integrated circuit (IC), the signal chain comprising:

a receiver to receive an input signal on an input node, and to generate a signal representing the input signal, the receiver being designed to process signals having a second logic-level swing, wherein the input signal is received on an input terminal of the IC;

a switch block coupled between the input terminal of the IC and the input node of the receiver, the switch block operable to prevent the input signal from being passed from the input terminal of the IC to the input node of the receiver in a first mode of operation of the input circuit, the input signal having a first logic-level swing in the first mode of operation, the switch block to pass the input signal from the input terminal of the IC to the input node of the receiver in a second mode operation of the input circuit, the input signal having the second logic-level swing in the second mode of operation, wherein transistors in the switch block are fabricated using a second process tailored for the second logic-level swing; and a second protection circuit, wherein the second protection circuit generates voltages on nodes of the switch block with values designed to prevent transistors in the switch block from being subjected to voltages exceeding a safe voltage determined by the second process, and wherein the second protection circuit is decoupled from the receiver in the second mode of operation.

8. The signal chain of claim 7, wherein the switch block comprises:

a first transistor with a drain terminal coupled to the input terminal, and a gate terminal coupled to receive a first mode signal;

a second transistor with a drain terminal coupled to a source terminal of the first transistor at a first junction node, a gate terminal coupled to receive a second mode signal, and a source terminal coupled to the input node of the receiver;

a third transistor with a drain terminal coupled to the input terminal, and a gate terminal coupled to a constant reference potential; and a fourth transistor with a drain terminal coupled to a source terminal of the third transistor at a second junction node, a gate terminal coupled to receive a third mode signal, and a source terminal coupled to the input node of the receiver, wherein the first mode signal, the second mode signal and the third mode signal are received with values which, in the first mode of operation, cause the switch block to prevent the input signal from being passed from the input terminal of the IC to the input node of the receiver, and wherein the first mode signal, the second mode signal and the third mode signal are received with values which, in the second mode of operation, cause the switch block to pass the input signal from the input terminal of the IC to the input node of the receiver.

9. The signal chain of claim 8, wherein the second protection circuit comprises:

a fifth transistor with a source terminal coupled to a first power supply voltage, and a gate terminal coupled to the input terminal;

a sixth transistor with a source terminal coupled to a drain terminal of the first transistor, a gate terminal coupled to receive the third mode signal, and a drain terminal coupled to the first junction node;

a seventh transistor with a source terminal coupled to the first power supply voltage, and a gate terminal coupled to the third mode signal; and an eighth transistor with a drain terminal coupled to a drain terminal of the seventh transistor, a gate terminal coupled to the input terminal, and a source terminal coupled to the second junction node, whereby, in the first mode of operation of the input circuit, transistors of the second protection circuit are operable to maintain the first junction node and the second junction node at a voltage equal to the first power supply voltage, thereby preventing the first transistor and the third transistor from being subjected to inter-terminal voltages exceeding the safe voltage.

10. The signal chain of claim 9, further comprising a third protection circuit, wherein the third protection circuit couples a second power supply voltage to the receiver for operation in the second mode, the second protection circuit decoupling the second power supply voltage from the receiver in the second mode and connecting the first power supply voltage to the input node in the first mode.

* * * * *